United States Patent [19]
Dorleans et al.

[11] Patent Number: 5,599,725
[45] Date of Patent: Feb. 4, 1997

[54] METHOD FOR FABRICATING A MOS TRANSISTOR WITH TWO-LAYER INVERSE-T TUNGSTEN GATE STRUCTURE

[75] Inventors: Fernand Dorleans, Wappingers Falls; Liang-Choo Hsia, Stormville; Louis L. C. Hsu, Fishkill; Gerald R. Larsen, Cornwall; Geraldine C. Schwartz, Poughkeepsie, all of N.Y.

[73] Assignee: International Business Machines Corporation, Armonk, N.Y.

[21] Appl. No.: 346,210

[22] Filed: Nov. 22, 1994

Related U.S. Application Data

[62] Division of Ser. No. 125,357, Sep. 21, 1993, which is a continuation of Ser. No. 900,869, Jun. 18, 1992, abandoned.

[51] Int. Cl.$^6$ ................................................. H01L 21/8234
[52] U.S. Cl. ............................ 437/40; 437/44; 437/913; 437/192
[58] Field of Search .............................. 437/40, 44, 913, 437/200, 160; 148/DIG. 105

[56] References Cited

U.S. PATENT DOCUMENTS

| | | |
|---|---|---|
| 4,319,932 | 3/1982 | Jambotkar . |
| 4,356,623 | 11/1982 | Hunter . |
| 4,901,128 | 2/1990 | Sunami et al. . |
| 4,906,589 | 3/1990 | Chao .................... 437/44 |
| 4,963,504 | 10/1990 | Huang .................. 437/44 |
| 4,984,042 | 1/1991 | Pfiester et al. . |
| 5,049,514 | 9/1991 | Mori ..................... 437/200 |
| 5,140,403 | 8/1992 | Hikichi et al. . |
| 5,162,884 | 11/1992 | Liou et al. ............ 437/41 |
| 5,182,619 | 1/1993 | Pfiester ................ 257/382 |
| 5,217,923 | 6/1993 | Suguro ................. 437/200 |
| 5,304,504 | 4/1994 | Wei et al. ............. 437/44 |
| 5,306,655 | 4/1994 | Kurimoto ............. 437/41 |

FOREIGN PATENT DOCUMENTS

| | | |
|---|---|---|
| 63-42173 | 2/1988 | Japan . |
| 1206667 | 8/1989 | Japan . |

OTHER PUBLICATIONS

"Deep Submicron Tungsten Gate CMOS Technology"; Naoki Kasai et al.; 1988 IEEE; IEDM 88; pp. 242–245; NEC Corporation.

"Gate Materials consideration for Submicron CMOS"; C. Y. Ting et al.; IBM T. J. Watson Research Center; Applied Surface Science 38, 1989; pp. 416–427.

"Highly Reliable Tungsten Gate Technology"; N. Kobayashi et al.; Hitachi Ltd.; 1987 Materials Research Society; pp. 159–167.

"A Novel Submicron LDD Transistor With Inverse-T Gate Structure"; Tiao-yuan Huang et al.; IEDM 86; Xerox Palo Alto Research Center; IEEE 1986; pp. 742–745.

"A Selectively Deposited Poly-Gate ITLDD Process with Self-Aligned LDD/Channel Implantation"; James R. Pfiester et al.; IEEE 1990; pp. 253–255.

"High Resolution Tungsten Patterning Using Buffered, Mildly Basic Etching Solutions"; T. A. Shankoff et al.; Bell Laboratories, New Jersey; J. Electrochem. Soc.; Feb. 1975; pp. 294–298.

*Primary Examiner*—Brian E. Hearn
*Assistant Examiner*—Michael Trinh
*Attorney, Agent, or Firm*—Whitham, Curtis, Whitham & McGinn; Harold Huberfeld, Esq.

[57] ABSTRACT

The present invention is directed to a unique method for fabricating a silicon based MOS transistor having an inverse-T refractory metal gate structure. The gate fabricated according to this invention comprises a main CVD tungsten portion and a lower sputtered tungsten portion outwardly extending from the bottom of the CVD portion such that a cross section of the gate appears as an inverted "T". A $Cl_2/O_2$ plasma etch is used to etch the CVD tungsten layer and a chemical etch is used to etch the sputtered tungsten layer to form the gate electrode. It has been discovered that sputtered tungsten is more resistant to $Cl_2/O_2$ reactive ion etch than is CVD tungsten. The sputtered tungsten layer acts as a shield to protect the underlying gate oxide layer from ion damage throughout the fabrication process.

11 Claims, 2 Drawing Sheets

METHOD FOR FABRICATING A MOS TRANSISTOR WITH TWO-LAYER INVERSE-T TUNGSTEN GATE STRUCTURE

This application is a divisional of application Ser. No. 08/125,357, filed on Sep. 21, 1993, which is a File Wrapper Continuation application of Ser. No. 07/900,869 filed Jun. 18, 1992, abandoned.

BACKGROUND OF THE INVENTION

1. Field of the Invention

The present invention generally relates to an improved method for fabricating MOS transistor gates and, more particularly, to a fabrication method for inverse-T type tungsten gate structures by reactive ion etch (RIE).

2. Description of the Prior Art

As will be appreciated by those skilled in the art, an inverse-T MOS transistor gate structure appears in cross section as an inverted "T". An article by Huang et al. entitled "A Novel Submicron LDD Transistor with Inverse-T Gate Structure," *IEDM Tech Dig.*, 1986, pp. 742–745, which is herein incorporated by reference, discloses a typical lightly doped drain (LDD) transistor structure having an inverse-T gate structure made of polysilicon. In an inverse-T gate structure a portion of the gate extends beneath oxide sidewall spacers which surround and insulate the gate structure. Huang disclosed extending a portion of the gate beneath the oxide sidewall spacers improves transistor performance by providing better gate controllability.

Polysilicon inverse-T gates are widely used and are fabricated with methods well established in the art. Briefly, in these methods, a polysilicon film, from which the gate is to be formed, is deposited over a gate silicon oxide layer. The polysilicon is subjected to a reactive ion etch (RIE) which partially removes the polysilicon material adjacent a defined gate region. The etching process is stopped arbitrarily by timed etch so that a thin layer polysilicon of about 50–100 nanometers remains on the lower portion of the gate. Source and drain doping is accomplished by ion implantation directly through the thin polysilicon portion. Sidewall spacers, which act as a mask for additional source and drain implantation and etching steps, are formed around the gate by chemical vapor deposition (CVD). After the RIE and ion implantation steps the gate oxide layer is damaged. Therefore, it is necessary regrow the gate oxide layer to repair it. An additional problem with this approach is that the thickness of the remaining polysilicon is dependent on the etch process control.

Technology has steadily been moving to smaller transistor devices having superior performance characteristics. Polysilicon is the most commonly used material to fabricate MOS gate structures. Unfortunately, polysilicon possesses inherent material limitations which makes it unsuitable for submicron VLSI gate electrode applications. The resistances of polysilicon and silicided polysilicon gates are relatively high at 60 $\Omega$/square and 20 $\Omega$/square, respectively. The resistances of these gates become even higher as size is scaled down. In addition, it is difficult for buried channel MOSFETs to suppress their short channel effects when a polysilicon gate is used.

Naoki Kasai et al., Deep-Submicron Tungsten Gate CMOS Technology, *IEDM Tech. Dig.*, 1988, discusses metal gate technology and, more particularly, focuses on the advantages of tungsten in VLSI gate electrode applications. Tungsten gates possess a resistance of less than 5 $\Omega$/square. Devices having tungsten gates have a 30% transconductance increase and have a low subthreshold slope value which is responsible for a large on/off ratio.

In addition, tungsten is an ideal metal for CMOS transistor gates because it's work function is coincidentally near silicon's mid-bandgaps. This provides symmetrical operation for n- and p-channel devices with equal threshold values. See C. Y. Ting et al., Gate Materials Consideration for Submicron CMOS, *Applied Surface Science*, 38 (1989) pp. 416–428.

Although tungsten seems an ideal material for MOS gate electrodes, it is not without it's problems. Due to radical differences between tungsten and silicon processing requirements, no process exists which easily allows tungsten gates to be fabricated together with silicon MOS transistors. The most serious problem with tungsten is it forms volatile oxide at low temperature. As mentioned above, during the transistor fabrication process inherent damage occurs to the gate silicon oxide layer which necessitates regrowth. This is typically accomplished by oxidizing the silicon at temperatures of 900°–1000° C. in oxygen ambient for a period of time. Since, tungsten forms volatile oxides at only 300° C., it is clear that a serious conflict exists.

To overcome this problem, N. Kobayashi et al., *Highly Reliable Tungsten Gate Technology*, Materials Research Society, 1987, proposes a wet hydrogen oxidation method wherein he suggests that he is able to oxidize the silicon without oxidizing the tungsten. The method involves using hydrogen with the appropriate amount of water along with a thin film if polysilicon, sandwiched between a tungsten gate and a gate oxide layer. This process is complicated and still requires polysilicon as an adhesive layer between the tungsten and the silicon oxide.

SUMMARY OF THE INVENTION

It is therefore an object of the present invention to provide method for fabricating a silicon based MOS transistor having a refractory metal gate.

It is another object of the present invention to provide an inverse-T tungsten gate for a MOS transistor which is fabricated from a first layer of relatively high density refractory metal and a second layer of relatively low density refractory metal.

It is yet another object of the present invention to provide a transistor having shallow source/drain junctions.

The present invention is directed to a unique method for fabricating a silicon based MOS transistor having an inverse-T tungsten gate structure. The fabrication method involves depositing a relatively dense layer of refractory metal, for example, chemical vapor deposition (CVD) tungsten, on top of a thinner layer of less dense refractory metal, such as sputter deposition tungsten which, promotes adherence to a gate oxide layer grown on a silicon substrate.

A nitrite mask defines a gate region on the top, CVD tungsten layer. A $Cl_2/O_2$ plasma etch is used to etch the top CVD tungsten layer using the nitrite mask. The etching process is slowed down when reaching sputtered tungsten layer.

It has been discovered that $Cl_2/O_2$ plasma reactive ion etch removes CVD tungsten approximately three times faster than the sputtered tungsten. The sputtered tungsten is therefore more resistant to the $Cl_2/O_2$ reactive ion etch than is the CVD tungsten. Thus, the sputtered tungsten layer acts as a shield to protect the underlying oxide layer from ion damage; therefore, the gate oxide integrity can be maintained and does not require regrowth.

Ion implantation of the source and drain junctions is performed directly into the sputtered tungsten layer prior to forming a gate sidewall spacer. The sidewall spacer is formed around the CVD tungsten gate portion. A sidewall annealing step is performed which also serves to the drive dopant ions into the silicon substrate to formulate shallow source/drain junctions.

The sputtered tungsten layer extending beyond the sidewall spacer is then removed using a mildly basic chemical etching solution.

The thusly fabricated tungsten gate comprises a main CVD tungsten portion and a lower sputtered tungsten portion outwardly extending from the bottom of the CVD portion such that a cross section of the tungsten gate appears as an inverted "T". The silicon oxide layer remains undamaged throughout the fabrication process.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
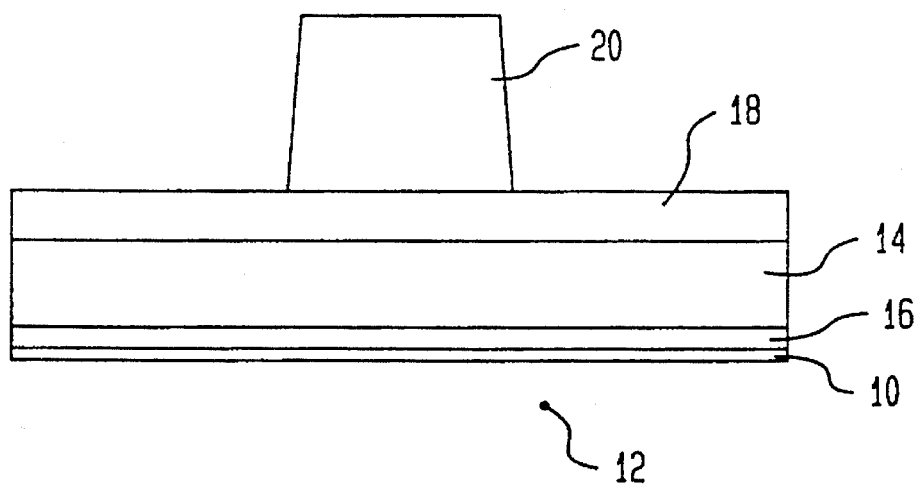
FIG. 1 is a view of various layers on a silicon substrate prior to etching an inverse-T tungsten gate.

Referring now to the drawings, and more particularly to FIG. 1, a gate oxide layer 10 which has been grown on a silicon substrate 12, supports tungsten layers 14 and 16, which comprise the gate electrode of a finished MOS transistor.

There are three common methods by which tungsten layers may be deposited: chemical vapor deposition (CVD), evaporation and sputtering. CVD tungsten films have high purity and low resistivity; however they are large grained films and do not adhere well to silicon oxide. Evaporated tungsten films have a fine grain structure; however they have high electrical resistance and high stress and exhibit poor adhesion to silicon oxide. Sputtered tungsten films have a fine grain structure, low electrical resistivity and an adjustable stress level for good silicon oxide adhesion. See C. Y. Ting et al., cited above.

Tungsten layer 16 is deposited on gate oxide layer 10 a suitable sputter deposition method. Sputter deposition methods are well known in the art and are generally performed in a high vacuum deposition system. A tungsten target material is bombarded by ions. Tungsten atoms are released from the tungsten target and deposit to form a thin tungsten film over the gate oxide layer 10. In the preferred embodiment the sputtered tungsten layer 16 is approximately 800 Å thick.

A second tungsten layer 14 is deposited by CVD techniques on top of the sputtered tungsten layer 16. CVD techniques are well known in the art and entail passing a vapor containing tungsten atoms over the silicon substrate 12 in a suitable CVD apparatus such that a tungsten film is formed. In the preferred embodiment, the CVD tungsten layer 14 is approximately 3500 Å thick.

A nitride mask 18 is deposited over the CVD tungsten layer 14 using plasma enhanced chemical vapor deposition or photo enhancement (PECVD) techniques. PECVD techniques are also well known in the art. PECVD techniques take advantage of laser or UV light and allow deposition at lower temperatures.

A resist mask 20 is applied over the nitride mask 18 and is patterned to define a gate electrode. The nitride layer 18 is etched in a $CF_4$ plasma etch to form a nitride mask 18A. At this point the resist is stripped.

Figure 2:
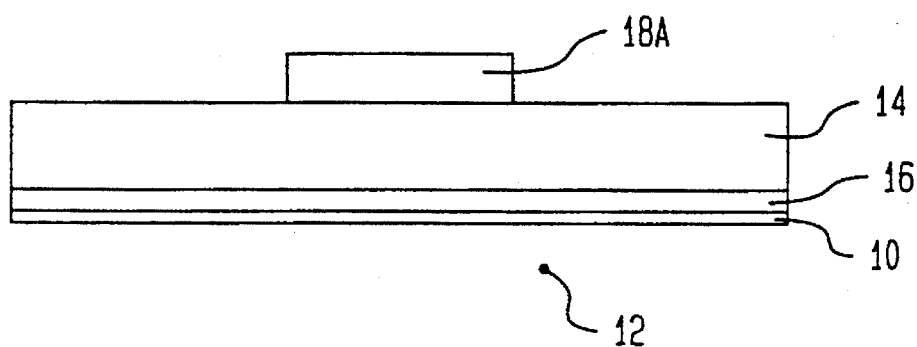
FIG. 2 is a view of FIG. 1 showing a nitrate layer which defines the top of the tungsten gate.

Referring now to FIG. 2, the nitride mask 18A now defines placement and pattern the gate electrode. A $Cl_2/O_2$ plasma etch process is used to etch the CVD tungsten layer 14 which are not protected by the nitride mask 18A. In the preferred embodiment, the $Cl_2/O_2$ etch takes place in a single plasma etch reactor which typically consists of pressurized chamber, a vacuum supply, an rf power supply connected to an electrode and a grounded electrode. In the preferred embodiment the chamber pressure is 100 mTorr, the oxygen flow rate is 12 sccm, the chlorine flow rate is 40 sccm, the rf power is 625 Watts and the electrode spacing is kept at 8 cm. Under these conditions, the etch rate of CVD tungsten is approximately 5000 Å/min and the etch rate of sputtered tungsten is significantly less at only 1700 Å/min. This shows about a 3:1 difference between CVD tungsten and sputtered tungsten films. The sputtered tungsten shows greater resistivity to the $Cl_2/O_2$ reactive ion etch processes than does the CVD tungsten. The sputtered tungsten acts as a shield for the underlying oxide layer to protect it from ion damage throughout the fabrication process. With this process, the etch ratio of CVD tungsten to mask nitride is more than 10:1.

Figure 3:
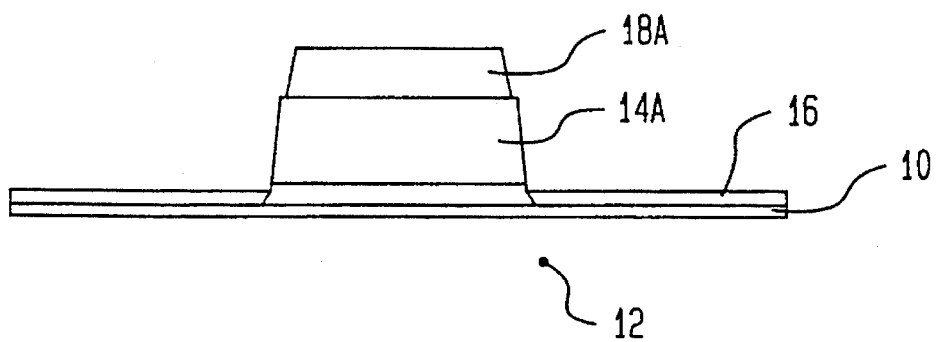
FIG. 3 is a view of FIG. 2 after plasma etching the CVD tungsten layer.

FIG. 3 shows a top portion of tungsten gate electrode 14A after the $Cl_2/O_2$ plasm etch. An over-etch of about 30% into the sputtered tungsten layer 16 is needed to compensate for tungsten film non-uniformity and surface topography to ensure that all CVD tungsten not protected by the nitride mask 18A is removed. The gate oxide layer 10 is completely covered and protected by the sputtered tungsten layer 16 throughout the etching process. It is estimated that the thickness of the remaining sputtered tungsten 16 is about 500±50 Å, which is thick enough to effectively shield the oxide layer 10 from reactive ion damage.

Figure 4:
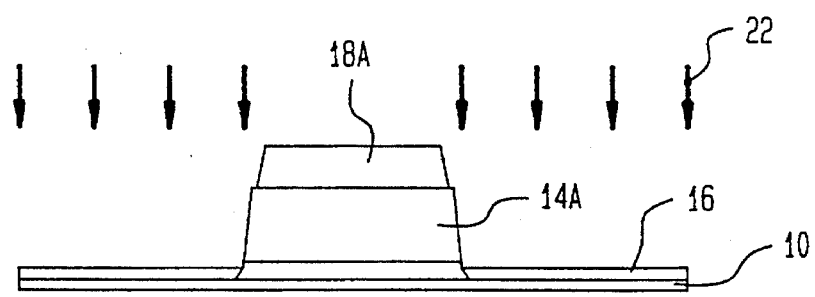
FIG. 4 is view of the source/drain ion implant step.

FIG. 4 shows the source/drain implant which is performed directly into the remaining sputtered tungsten layer 16. Dopant ions 22 are implanted into the sputtered tungsten 16. The power of the of the ion implant is regulated such that dopant ions do not penetrate and reach active areas of the gate oxide layer 10 wherein they would cause harm.

Figure 5:
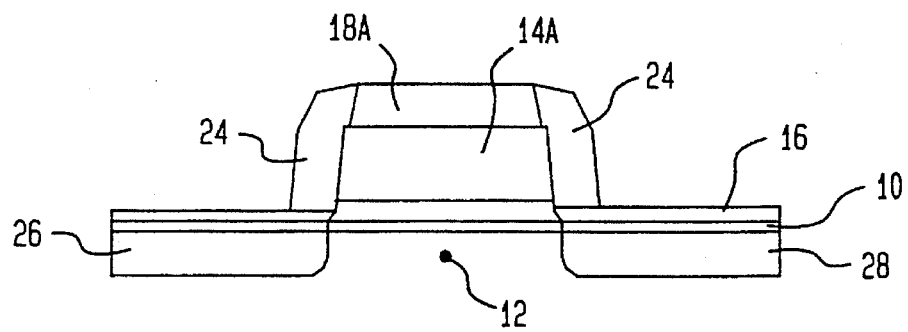
FIG. 5 is a view showing a sidewall spacer surrounding the tungsten gate electrode.

FIG. 5 shows a sidewall spacer 24 formed around the CVD tungsten gate electrode 14A and extending laterally over a portion of the sputtered tungsten layer 16. The sidewall spacer 24 is made by directional etch back of a suitable CVD dielectric film, such as oxide, nitride, or CVD TEOS (tetraethyl orthosilicate), to leave the film on the sidewalls of the gate electrode. Concurrent with a sidewall spacer 24 annealing step, the source 26 and drain 28 regions are formed as the dopants 22 implanted into the sputtered tungsten layer 16 in the source and drain regions diffuse through the gate oxide layer 10 and into the silicon substrate 12. Since the gate oxide layer 10 beneath the gate region is completely protected bysputtered tungsten layer 16 throughout this process, neither RIE nor ion implant damage is incurred. Subsequently, oxide regrowth, which would otherwise damage the tungsten gate, is avoided.

Figure 6:
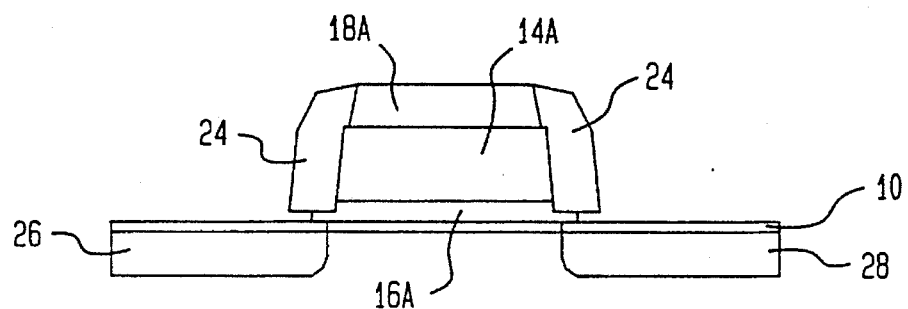
FIG. 6 is a view showing the remaining sputtered tungsten after excess was removed with a chemical etching solution.

Referring now to FIG. 6, portions of the sputtered tungsten layer 16 which are not covered by the sidewall spacer 24 are selectively etched away using a buffered, mildly basic chemical etching solution such as, for example, $KH_2PO_4/KOH/K_3Fe(CN)_6$. This solution will not attack the spacer oxide or the gate oxide material. Such solutions suitable for the practice of the present invention are known in the art and are discussed in T. S. Shakoff et al., High Resolution Tungsten Patterning Using Buffered, Mildly Basic Etching Solutions, *J. Electrochem. Soc.*, Vol. 122, February, 1975, which is herein incorporated by reference.

Figure 7:
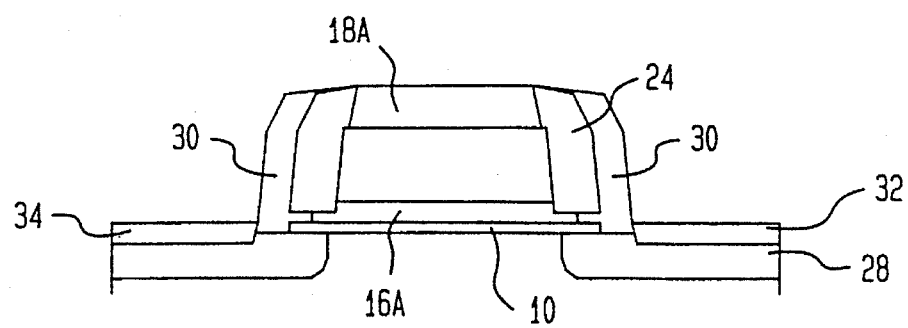
FIG. 7 is a view of the finished MOS transistor having an inverse-T tungsten gate.

FIG. 7 shows the finished MOS transistor. The gate oxide layer 10 in the source 26 and drain 28 areas is removed using a hydrofluoric acid (BHF) solution. A CVD oxide is deposited and etched back to form a second sidewall spacer 30 on the gate electrode sidewalls. This is preferably done in a multi-chamber cluster dep/etch tool. The second spacer is used to prevent the gate from shorting with the source 26 and drain 28. Silicide, 34 and 32, is formed on top of the exposed source 26 and drain 28 on the silicon surface 12. An additional dopant implantation step and subsequent drive-in step may be preformed directly into the silicide 32 and 34 in order to reduce contact and series resistance.

While the invention has been described in terms of a single preferred embodiment, those skilled in the art will recognize that the invention can be practiced with modification within the spirit and scope of the appended claims. For example, refractory metals other than tungsten, may be used in the practice of the present invention. Molybdenum is an example of such a refractory metal.

Having thus described my invention, what we claim as new and desire to secure by Letters Patent is as follows:

1. A method for fabricating a refractory metal gate electrode for a MOS transistor, comprising the steps of:

depositing a first layer of refractory metal having a first density on a gate oxide layer formed on a silicon substrate;

depositing a second layer of refractory metal having a second density on said first layer of refractory metal; wherein said first density is lower than said second density;

etching said second layer to form an upper gate electrode portion; and, partially etching a thickness of said first layer to form a lower portion of said gate electrode that extends laterally beyond said upper gate electrode portion.

2. A method for fabricating a refractory metal gate electrode for a MOS transistor, as recited in claim 1 wherein said refractory metal is molybdenum.

3. A method for fabricating a refractory metal gate electrode for a MOS transistor, as recited in claim 1 wherein said refractory metal is tungsten.

4. A method for fabricating a refractory metal gate electrode for a MOS transistor, comprising the steps of:

depositing a first layer of refractory metal having a first density on a gate oxide layer formed on a silicon substrate;

depositing a second layer of refractory metal having a second density on said first layer of refractory metal; wherein said first density is lower than said second density, wherein said first layer of refractory metal is deposited by sputter deposition and said second layer of refractory metal is deposited by chemical vapor deposition;

etching said second layer to form an upper gate electrode portion; and, partially etching a thickness of said first layer to form a lower portion of said gate electrode that extends laterally beyond said upper gate electrode portion.

5. A method for fabricating a tungsten gate electrode for a MOS transistor, comprising the steps of:

depositing a first layer of tungsten having a first density on a gate oxide layer formed on a silicon substrate;

depositing a second layer of tungsten having a second density on said first layer of tungsten metal; wherein said first density is lower than said second density;

etching said second layer to form an upper gate electrode portion; and, partially etching a thickness of said first layer to form a lower portion of said gate electrode that extends laterally beyond said upper gate electrode portion, wherein said second tungsten layer is etched by $Cl_2/O_2$ plasma, said first tungsten layer acting to stop said $Cl_2/O_2$ plasma etch.

6. A method for fabricating a tungsten gate electrode for a MOS transistor, comprising the steps of:

depositing a first layer of tungsten having a first density on a gate oxide layer formed on a silicon substrate;

depositing a second layer of tungsten having a second density on said first layer of tungsten metal; wherein said first density is lower than said second density;

etching said second layer to form an uppergate electrode portion; and, partially etching a thickness of said first layer to form a lower portion of said gate electrode that extends laterally beyond said upper gate electrode portion, wherein said first tungsten layer is etched by wet chemical etch.

7. A method for fabricating a refractory metal gate electrode for a MOS transistor, as recited in claim 6 wherein said wet chemical etch comprises $KH_2PO_4/KOH/K_3Fe(CN)_6$.

8. A method for fabricating a refractory metal gate electrode for a MOS transistor, as recited in claim 1, further comprising the steps of:

implanting impurity ion dopants into a portion of said first layer using said upper gate electrode as a mask, said dopants being contained within said first layer during said implanting step;

annealing said silicon substrate to drive-in said dopant to form a shallow source region and a shallow drain region.

9. A method for fabricating a refractory metal gate electrode for a MOS transistor, as recited in claim 1, further comprising the steps of:

forming a first sidewall spacer about said upper gate electrode portion, said first sidewall spacer extending over a portion of said lower gate electrode portion;

forming a second sidewall spacer about said first sidewall spacer after said step of etching said first layer.

10. A method for fabricating a refractory metal gate electrode for a MOS transistor, as recited in claim 9, further comprising the steps of:

forming a silicide over said source region and said drain region;

implanting dopant into said silicide;

driving said dopant into said source region and said drain region, said dopant for reducing contact and series resistance.

11. A method for fabricating a refractory metal gate electrode for a MOS transistor, as recited in claim 1, wherein said first layer is thinner than said second layer.

* * * * *